United States Patent [19]

Fraser

[11]  4,408,169
[45]  Oct. 4, 1983

[54] FREQUENCY ENCODING CLOSED LOOP CIRCUIT WITH TRANSDUCER

[75] Inventor: Allan B. Fraser, Woodbine, Md.

[73] Assignee: The John Hopkins University, Baltimore, Md.

[21] Appl. No.: 264,952

[22] Filed: May 18, 1981

[51] Int. Cl.³ ............................................. G01N 27/00
[52] U.S. Cl. ..................................... 331/65; 331/111; 331/143
[58] Field of Search ................... 331/65, 66, 111, 143; 328/1, 2, 3, 4, 5, 6; 340/870.12, 870.26; 324/236, 327

[56] References Cited

U.S. PATENT DOCUMENTS 3,555,448  1/1971  Clarke, Jr. et al. ................... 331/65
3,763,322  10/1973 Garcia et al. ......................... 331/111
4,006,430  2/1977  Meyer-Ebrecht ..................... 331/65

Primary Examiner—Siegfried H. Grimm
Assistant Examiner—S. V. Clark
Attorney, Agent, or Firm—Robert E. Archibald; Leonard W. Pojunas, Jr.

[57] ABSTRACT

A frequency encoding closed loop circuit with transducer, comprising a closed inner digital loop nested in a closed outer loop which carries both digital and analog signals, associates a corresponding frequency output to variations in the magnitude of physical quantity input to a transducer which is contained within the outer loop. The encoder achieves the advantage of synchronous detection in converting changes in a transduced quantity into a frequency count. The encoder produces frequency shifts at its output that are proportional to the transducer input and are significantly immune to noise and power input fluctuations.

20 Claims, 5 Drawing Figures

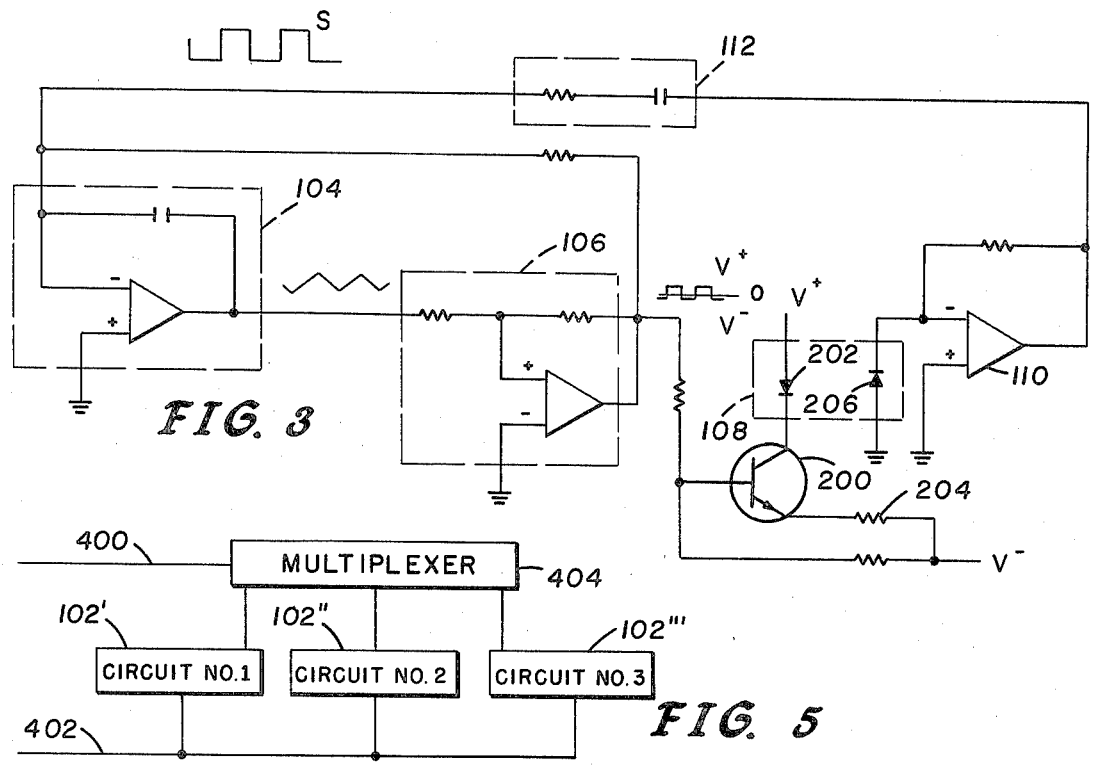
FIG. 3
FIG. 5
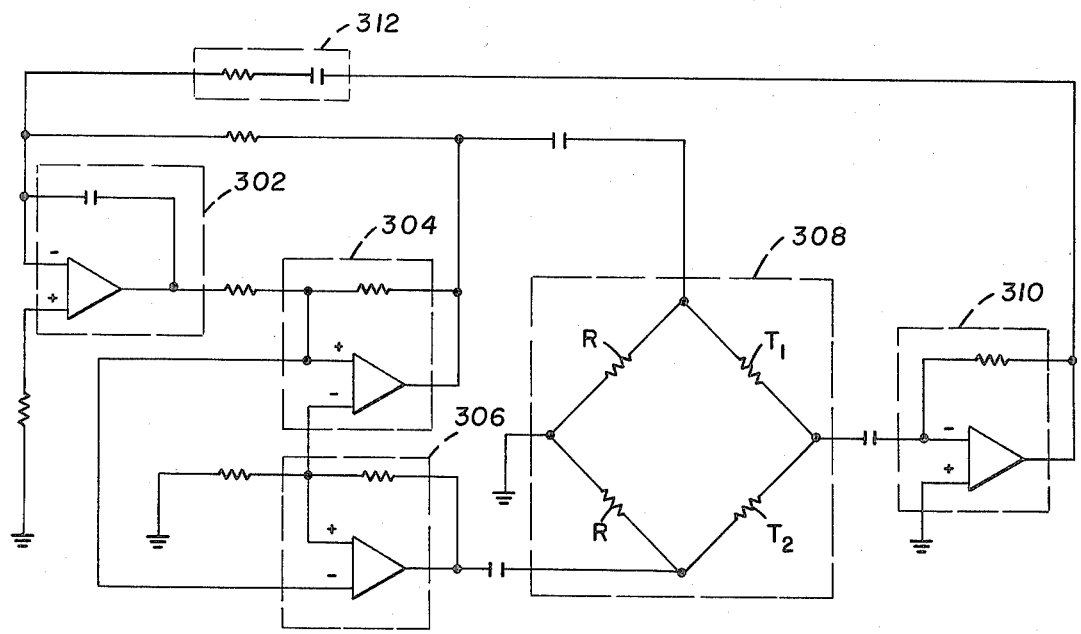
FIG. 4

FREQUENCY ENCODING CLOSED LOOP CIRCUIT WITH TRANSDUCER

STATEMENT OF GOVERNMENTAL INTEREST

The invention herein described was made in the course of or under a contract or subcontract thereunder with the Department of the Navy.

FIELD OF THE INVENTION

The present invention relates to converters or encoders which provide a frequency output as a function of input to a transducer.

TECHNOLOGICAL CONTEXT OF THE INVENTION

The problem of converting variations in a physical quantity which is measurable by a transducer into a frequency output has been addressed by numerous inventors. The approach, however, has generally been directed to improving on and enhancing open loop technology where an electrical signal from a transducer is the input, and an amplifier and voltage-to-frequency converter follow in series.

In 1966, Roth et al. in U.S. Pat. No. 3,256,426 disclosed a totalizer which receives an analog input signal the magnitude of which is proportional to the rate of flow of a fluid over time and which generates a count corresponding to that magnitude. To generate the desired count, a triangular wave is produced by an integrator with the input to the integrator being reversed whenever the level of the integrator output reaches a predetermined positive or negative threshold. With an electrical signal input corresponding to the magnitude of a fluid, gas, or electrical flow, a count corresponding to magnitude is generated. After Roth et al., U.S. Pat. No. 3,449,695 invented by Marsh, U.S. Pat. No. 3,539,825 invented by Hardaway and U.S. Pat. No. 3,989,961 invented by Masreliez were introduced into the transducer technology, further developing open loop voltage-to-frequency conversion, each employing integrating amplifiers which are switched to provide a pulse rate output which corresponds to the magnitude of the voltage input. Schmidhauser then, in U.S. Pat. No. 3,639,893, disclosed an integrator followed by a threshold switch arrangement wherein positive and negative threshold pulses are fed back to the integrator in order to synchronize a "measurement" with a "clock". According to Schmidhauser, the ratio of capacitor discharge pulses to pulses in a measurement period is proportional to changes in magnitude of an applied input voltage. Finally, in the contemporaneous U.S. Pat. No. 4,124,821 Petr has also addressed the problem of converting an analog signal to a frequency output, disclosing an integrator which is followed by a threshold switch stage and a Schmitt trigger stage, the output from the trigger stage feeding back to provide an input to the integrator.

These representative converters have all disclosed open loop circuitry. While processing an input signal to provide a corresponding count or count rate output, none of the above discussed patents contemplated the driving of an input transducer with the output frequency generated in a closed loop design. Accordingly, none of the patents provide noise rejection benefits arising from synchronous excitation of the transducer by the output signal of the encoder which has the transducer's analog output frequency encoded in it. As open loop designs, such converters have thus been susceptible to encoding noise and possible cumulative error due to DC drifts that are present in their analog inputs. Further, as seen in Petr, analog-to-frequency converters which include the switching of an integrated signal can be somewhat elaborate by including charge variation compensation elements and threshold control elements. Such converters can thus often require considerable power expenditure.

An invention described by Brausch in the contemporaneous U.S. Pat. No. 4,115,767 described an analog-to-digital converter wherein voltage to frequency conversion is included. In particular, the analog output from a transducer enters a voltage-to-frequency converter with the frequency output being transferred to a digital display. FIG. 2 of that patent shows the transducer acting on a bridge circuit to provide an analog signal to a voltage-to-frequency converter, such as those described in the aforementioned patents. The Brausch invention is directed to an open loop system wherein timing is provided by a reference oscillator rather than through a closed loop synchronous detection system. Variations in DC levels between the transducer stage input and the counter output stage are essentially unmonitored and uncontrolled in their effects on the output.

The concept of synchronous signal generating in a phase-locked loop circuit is taught by Ogita in current U.S. Pat. No. 4,037,165. In the Ogita patent, the phase of the output from a frequency divider is compared in a phase detector with a composite input signal. The purpose of the phase-locked loop is to provide an output signal which is synchronous with a component of the input signal. Ogita while employing a loop circuit to synchronize an output with an input, does not employ the output signal to effect the signal generated by a transducer input. Also, although Ogita achieves a synchronous output and the attendant benefits such as noise diminution, it is not directed to varying a frequency based on the magnitude of a varying input.

Finally, known technology, it should be noted, includes a closed loop circuit tuner having a variable resistor in a feedback loop connecting the output to the input of a relaxation oscillator. Such circuitry, however, does not consider the features of eliminating the effects of the gross quiescent impedance of a transducer by isolation techniques in order to encode only small variations in the transducer outputs; does not suggest amplifying small signal changes due to transducer output variations in order to enhance sensitivity; does not address noise rejection; and does not seek to combine the in-phase input to an output from a transducer in order to generate a frequency change responsive to variations in the magnitude of a physical quantity input to a transducer.

To date, no prior or present patents have considered the benefits of synchronous detection in a frequency encoding apparatus with an integral transducer. Further, existing technology does not contemplate a closed loop design wherein a frequency output generated by a transducing process is combined and integrated with the transducer input in order to achieve versatility, noise immunity, cost benefits, simplicity of power input, and selectable linear or non-linear operation as desired.

SUMMARY OF THE INVENTION

The present invention advances the art and achieves other benefits and advantages by combining synchronous detection characteristics with frequency encoding or conversion of transducer output. Customarily, "synchronous detection" is used to sense small signals at the noise limit where noise is limited by appropriate frequency translation techniques. Further, synchronous detectors attentuate DC drifts in amplifiers completely and allow the use of electronically quiet high frequency bands in amplifiers in order to amplify low frequency and low level signals. "Transducers," in accordance with the present invention, include those devices which produce an output which is proportional to the product of a drive signal to the transducer multiplied by a function of the physical quantity transduced. Proportional transducers, such as thermistor bridges, capacitance position sensors, strain gauge and pressure gauge bridges, fluorometers, conductivity cells, optical transmissometers, optical position and angle transducers, and other such devices are included within the present scope of the term. As suggested in the above TECHNOLOGICAL CONTEXT OF THE INVENTION, a "frequency encoder" is a device that produces a frequency (usually in a pulse train) which is proportional to a variable input, such as in a voltage-to-frequency converter, an FM radio, an acoustic modem for low speed digital communication over telephone lines, and various other physical quantity measuring devices.

Accordingly, the frequency encoding closed loop circuit produces an output frequency that is proportional to a quantity sensed by a transducer. By designing the encoder as a closed loop which includes a transducer, the invention produces frequency shifts at its output which are proportional to the quantity transduced. And, because the converter provides the advantages of synchronous detection, the frequency shifts produced have high noise rejection and immunity characteristics.

The generalized circuit which achieves this low noise feature consists of two nested digital loops and an analog loop. The analog loop and the outer digital loop are identical and include an integrator having an output which enters a Schmitt trigger (or the like), the output from the Schmitt trigger entering a proportional transducer, the frequency output from the transducer being isolated by an amplifier and fed back, perhaps through a filter, to the input of the integrator. The inner loop includes the integrator and Schmitt trigger, the output from the Schmitt trigger being fed back and combined with the signal exiting the outer digital/analog loop to form the input to the integrator. In a digital context, a digital rectangular wave in the outer loop provides input drive pulses to the transducer, the period of which is based in part on the magnitude of the signal generated by the transducer. In the analog context, the digital drive signal applied to the transducer is amplitude modulated by the transducer in response to variations in the amplitude of the physical quantity sensed by the transducer. The output of the transducer is a rectangular wave whose amplitude is determined by the product of the fixed amplitude of the digital drive signal and magnitude of the physical quantity sensed by the transducer. At the input of the inner digital loop its own digital output is combined with the analog rectangular signal exiting the outer loop. The combined signal into the integrator and Schmitt trigger of the inner loop effects a new digital drive signal to the transducer.

The nested loop arrangement not only functions as a frequency encoder for the transducer having the benefits of synchronous detection, but also achieves cost and circuitry economy by conveying different modes of information, i.e. digital and analog, over the same circuit path and by using the same elements in the circuit for multiple functions. For example, the integrator (which is an integral element of the three loops) provides signal gain as well as integrating the combined signal. Similarly, an amplifier in the outer loop fed by the amplitude modulated bilevel signal carries a digital synchronizing signal in addition to providing amplification.

Further, the present circuitry achieves the noise advantages of synchronous detection without any switching of phase sync circuits as suggested by the above-discussed technology. By closing the loop of the circuit and combining the usually high-pass filtered output of the outer loop with the drive signal to the transducer, synchronization is achieved without the need for additional circuit elements. It is thus an object of the invention to achieve low cost and efficiency.

It should also be noted that the inner loop acts as a relaxation oscillator which improves the noise rejection characteristics of the circuit. That is, the output of the integrator is passed through a Schmitt trigger and provides a bilevel digital drive signal having a fixed amplitude and a rate governed by the oscillator. Where noise is present at a frequency which differs from the frequency of the relaxation oscillator of the inner loop, the noise is reduced by averaging by the integrator and is essentially nulled where the noise frequency is high. The effects of low frequency noise are minimized by the integrator in the relaxation oscillator, as the output frequency is only slightly sensitive to slowly varying input potentials. Residual noise and offset terms are quadratic and are small enough as to be negligible. The high-pass filter placed after the amplifier in the outer loop and before the integrator input rejects d.c. drifts and low frequency noises from the transduction-amplifier combination while passing the desired frequency band.

It is thus an object of the invention to convert only high frequency narrow band noise to a encoded frequency at the output and to provide noise rejection characteristic of synchronous detection in a frequency encoder or converter for a transducer.

It is further object of the present invention to provide one embodiment in which resultant frequency shifts are linear with respect to the output of the transducer. It is, however, another object of the invention to provide an embodiment which generates arbitrary non-linear transfer functions which could be used in linearizing non-linear transducers and generating functions such as logarithmic or exponential functions of transduced quantities. For example, a passive linear frequency-dependent circuit could be inserted in the circuit after the transducer output, for example, between the amplifier and the high-pass filter which follow the transducer in the outer loop of the circuit.

The amplitude and phase shifts which occur as the operating frequency of the relaxation oscillator changes with transduction will alter according to the circuit inserted between the amplifier and high-pass filter and will alter the effective amplitude fed back to the oscillator accordingly.

A further feature of the invention which relates to economy and minimization of parts relates to the employment of just two leads to convey both power to the circuit and extract output therefrom. Also related to power input, operation of the present circuit appears to be independent of power line fluctuations due to the ratiometric nature the circuit can have by judicious selection of the active components.

The invention is attractive in applications where a plurality of encoders acting as sensors are to be multiplexed into a single system. Where such a system has only two wires for input and output, the plurality of encoders, or sensors, can be placed in parallel to provide their respective outputs as desired.

The significance of including the transducer in the closed loop design of the present invention yields various positive results. Unlike simple relaxation oscillator circuits where the mean conductivity of a transducer in the feedback always influences the output frequency, such mean conductivity is not present in the frequency output of the relaxation oscillator of the inner loop. Further, unlike other simple relaxation circuits involving transducers in the feedback wherein small changes in the transducer output results in small changes in the system output, the present invention provides large, controllable changes in the system output in response to small changes in the output from the transducer. Finally, a circuit without the inclusion of an outer loop having a transducer isolation, and gain located therein would more appropriately be characterized as a low sensitivity variable frequency oscillator.

It is also an object of the present invention to provide an encoder having maximal sensitivity and minimal components as well as good noise rejection.

It is also an object of the invention to provide a frequency encoding circuit for a transducer which comprises a nested loop arrangement which includes an inner digital loop and an outer loop which carries both digital and analog information.

Further, it is an object of the invention to provide a frequency encoding circuit for a transducer which can be used with an electro-optical transducer, a bridge, a half-bridge, or other proportional transducer in applications such as vibration testing, flow measurements, temperature measurements and the like at a remote or local location with relatively high accuracy. From the various aforementioned features of the present invention, it should be realized that the present invention has as an object to provide a frequency encoding circuit with transducer which realizes the advantages of synchronous detection.

BRIEF DESCRIPTION OF THE DRAWINGS

FIGS. 3 and 4 illustrate specific, sample optical and thermistor bridge embodiments, respectively, of the present invention.

FIG. 5 illustrates a sensor system comprising a plurality of frequency encoding closed loop circuits with transducers.

DESCRIPTION OF THE INVENTION

Figure 1:
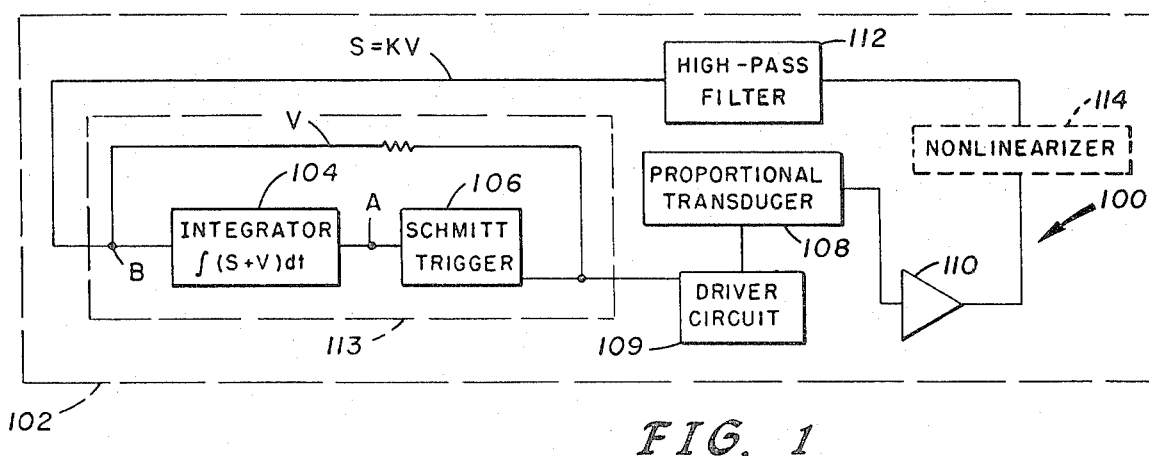
FIG. 1 shows a generalized block diagram of the present invention.

Referring to FIG. 1, a generalized block diagram illustrating the nested loop arrangement of the present frequency encoding closed loop circuit with transducer is shown. An outer loop 102 is shown comprising a conventional integrator 104 which is followed by a Schmitt trigger 106 the output of which provides a drive signal to a proportional transducer 108, which can include, but is not limited to, resistive, inductive, and capacitive bridges; photo optic devices, e.g., an LED conveying information to a photodetector, thermistor bridges, capacitance position sensors, strain gauge bridges, fluorometers, conductivity cells, optical transmissometers, various optical position and angle transducers, and other transducers which generate an electrical signal output proportional to a function of the amplitude of the physical quantity acting on the transducer. The proportional transducer 108 is driven by a signal from the Schmitt trigger 106, either directly or via a driver element 109. The output of the transducer 108 is an amplitude modulated bilevel signal which may, but need not, be in the form of a square wave. The amplitude modulated bilevel signal from the transducer 108 enters an amplifier 110. The amplifier 110 provide either isolation or gain both for the output of the transducer 108. A high-pass filter 112 blocks offset voltages from the amplifier 110 and passes a signal proportional to the physical quantity input back to the input of the integrator 104. The high pass filter 112 may be replaced with a bandpass filter, for further noise reduction, or may be replaced with a direct coupling, if offset from amplifier 110 is negligible.

Nested within the outer loop 102 is an inner closed loop 113 comprising the integrator 104 and the Schmitt trigger 106 in a relaxation oscillator configuration. The output from the Schmitt trigger 106 is fed back toward the input of the intergrator 104. The input to the integrator 104 is a composite signal formed by additively combining the output from the high-pass filter 112 with the digital drive signal from the Schmitt trigger 106, which signals have the same phase and pulse duration. The inner loop thus acts as a digital loop by generating pulses, in the form of an oscillation rate, at the output of the Schmitt trigger 106 in response to the composite signal input to the integrator 104.

The outer loop 102 may similarly be characterized as digital in that it conveys two-level, or bi-level, signals which both drive the proportional transducer 108 and provide feedback input to the integrator 104. The outer loop 102, however, also carries analog information where the levels of the switched amplitude modulated two-level signal from the driver gate 109 vary in amplitude as a function of the magnitude of the physical quantity acting on the proportional transducer 108. That is, in the case of a thermistor bridge transducer, for example, as the temperature increases the electrical output derived from the transducer 108 will result in a variation in the amplitude of the switched amplitude modulated two level signal entering the amplifier 110.

Figure 2:
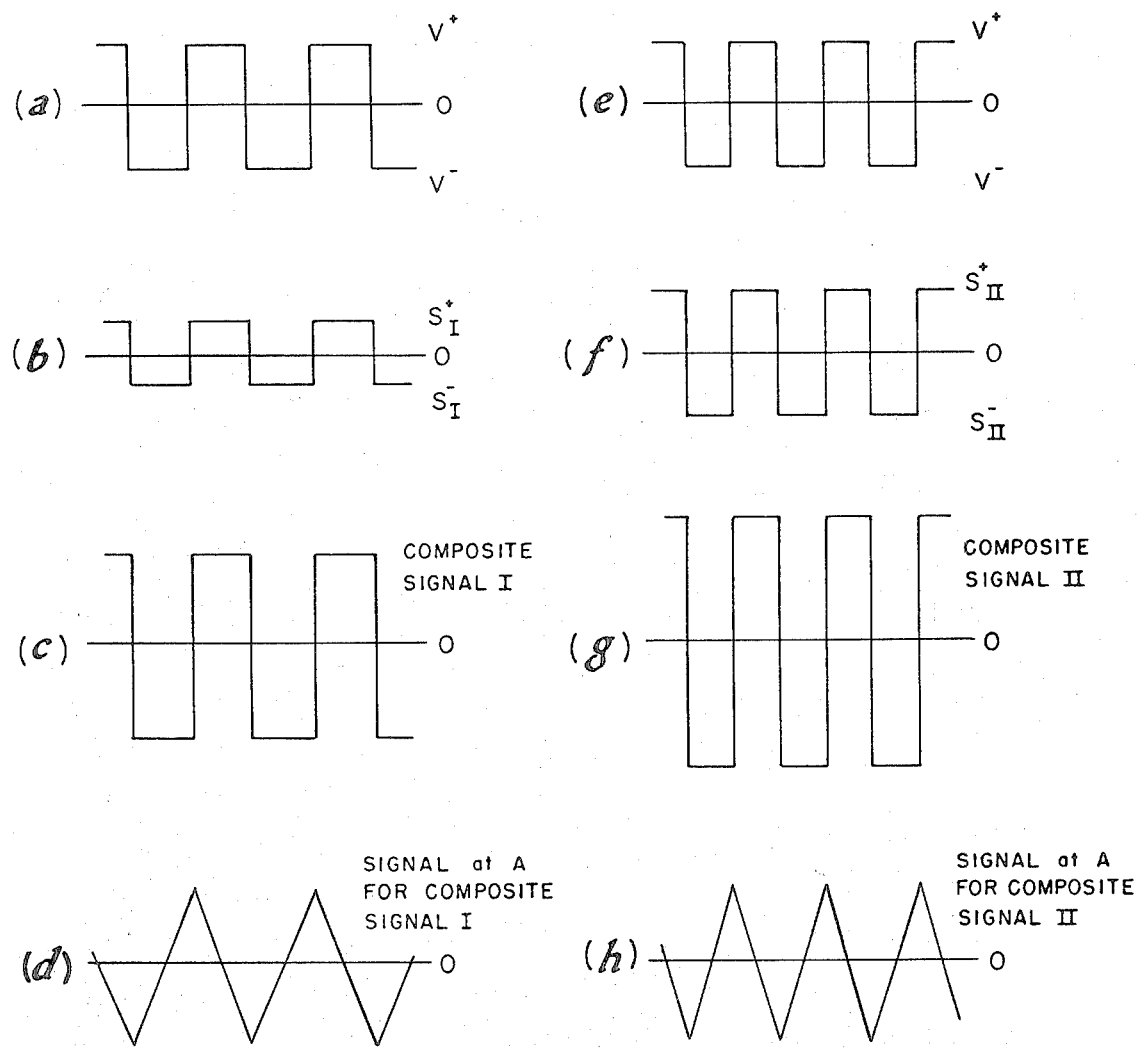
FIG. 2(a) through 2(h) show related signals which occur at various points in the diagram shown in FIG. 1.

In operation, the circuit of FIG. 1 has a drive signal V which has, for purposes of discussion, a rectangular wave characteristic which changes between a V+ and a V− voltage. Drive signal V shown in FIGS. 2(a) and 2(e) may or may not be symmetrical about a zero reference voltage and may or may not have a fifty percent duty factor. The signal V is combined with a signal S from the high-pass filter 112. The signal S is in-phase with the signal V from the Schmitt trigger 106 and may be defined as $S = KV$ where K is a factor relating to the physical quantity input to the transducer 108, the amplification factor of the amplifier 110, and the driver level V+ and V−. FIG. 2(b) represents a first level of signal, $S_I$, arising from the action of the drive signal on the transducer and the cumulative effects of amplifier 110 and the high pass filter 112. That signal is added to the signal V at the input of the integrator 104 (namely point B), such that a composite signal shown in FIG. 2(c) is presented to the integrator 104. The integrator 104 produces the ramp signals shown in FIG. 2(d) in response to its input. The ramp amplitude is limited by the threshold levels of the Schmitt trigger 106 —the Schmitt trigger reversing the polarity of both V and S when either threshold is reached. In FIG. 2 the V+ and V− output levels of the Schimtt trigger 106, which reflect the threshold levels, are shown symmetrical about a zero reference for convenience. That symmetry is not required for any aspect of the functioning of the circuit.

FIG. 2(e) shows the drive signal V when a physical quantity input larger than that which causes the signals shown in FIGS. 2(a), (b), (c), and (d) is presented to the transducer. The drive signal and the Schmitt trigger levels have the same amplitudes as they did in FIGS. 2(a), (b), (c), and (d), but a different frequency results in FIG. 2(e). The following discussion will demonstrate that the higher frequency must result from the action of the nested loops 113 and 102 when the larger physical quantity is applied to the transducer 108.

In FIG. 2(f), the magnitudes of $S_{II}+$ and $S_{II}-$ are shown larger than the magnitudes of $S_I+$ and $S_I-$ in FIG. 2(b). A larger physical quantity input results in a larger amplitude S signal. FIG. 2(g) shows the combination of the fixed amplitude V signal and the present level of the signal, i.e. $S_{II}$, in order to provide a composite signal input to the integrator 104. FIG. 2(g) shows a waveform greater in amplitude than that in FIG. 2(c). The action of the integrator 104 on the combined input shown in FIG. 2(g) appears in FIG. 2(h). The amplitude of the triangular wave in FIG. 2(h) is the same amplitude as that in FIG. 2(d); a condition imposed by the fixed threshold levels of the Schmitt trigger 106. The rate of increase and decrease of the signal at point A from integrator 104 is seen to be greater in FIG. 2(h) than in FIG. 2(d), since FIG. 2(h) represents the time integral of a larger constant than that in FIG. 2(d). Therefore, the time required for the waveform in FIG. 2(h) to travel from one Schmitt Trigger threshold level to the other is less than the corresponding time in FIG. 2(d). The shorter reversal time is shown to produce a higher frequency signal at point A. From FIGS. 2(a) through 2(h) it is shown that the frequency of the signals at point A and exiting the Schmitt trigger 106 in the nested loops 102 and 113 varies predictably as the physical quantity input influencing the transducer 108 varies. The encoding of the physical quantity input sensed by the transducer 108 to the shift in operating frequency of the loop is thereby effected. While the embodiment in FIGS. 2(a) through 2(h) show increasing frequency for an increase in the physical quantity input, larger physical quantities at the transducer 108 may alternatively, cause smaller signal frequencies. This opposite effect can be caused, for instance, if the gain of the amplifier 110 is made negative and all else remains unchanged; then a larger physical quantity influencing the transducer 108 causes a diminution of the frequency of operation of the nested loops 102 and 113.

Referring now to FIG. 3, a specific optical embodiment of the present invention is illustrated. The output of the integrator 104 enters a Schmitt trigger 106 the output from which enters the base of an npn transistor 200. Connected between the collector of the transistor 200 and a biasing voltage V+ is a light emitting diode (LED) 202. Between the emitter and a biasing voltage V− is a resistor 204. A drive signal from the Schmitt trigger enters the base of the transistor 200 thereby switching on the transistor 200 and permitting a well defined current to flow through the LED. An optical signal from the LED 202 is transmitted in proportion to the quantity of fluorescent substance present to a photo-detecting element 206 which, together with the LED 202, represent a proportional transducer 108. The optical signal is conventionally converted to an electrical signal which is synchronous with the drive signal and is thereafter amplified in element 110. The output from element 110 is then filtered through a high-pass filter 112 resulting in the signal S. As discussed relative to FIG. 1, as the magnitude of light transferred between the LED 202 and the photodetector 206 varies, so does the amplitude of the signal S. As the amplitude of the signal S varies, so does the amplitude of the composite signal entering the integrator 104. As seen by comparing FIGS. 2(d) and 2(h), the output from the integrator 104 will increase and decrease in rate according the magnitude of the composite signal.

Another embodiment of the invention is shown in FIG. 4. An integrator 302 provides input to a pair of parallel switching elements 304 and 306. The respective outputs from the switches 304 and 306 provide a drive signal across opposite nodes in a sample thermistor bridge 308. As shown in FIG. 4, the bridge 308 comprises two series resistors, indicated as R, in parallel with two series thermistors, indicated as T1 and T2. The drive signal is applied across two nodes: one between the thermistor T1 and one resistor R and the other between thermistor T2 and the other resistor R. The node between the two resistors is grounded whereas the node between the two thermistors T1 and T2 provides a amplitude modulated bilevel signal and magnitude of which is dependent in the thermal inputs to the thermistors T1 and T2. The amplitude modulated two-level signal produced at the node between thermistors T1 and T2 enters an amplifier 310, the purpose of which is to provide large, controlled output signals in response to small variations in the transducer thermistor bridge 308. As discussed in FIG. 1, the gain introduced by the amplifier 310 is accounted for in the variable K which is also a function of variations in the physical quantity which causes transduction. The output from the amplifier 310 enters the high-pass filter 312 to provide the signal S which then enters the integrator 302. The V signal which emanates from the output of one of the switches 304 feeds back into integrator 302 and also provides input to the bridge 308. The V signal and the S signal are combined at the input to the integrator 302.

As the temperature applied to thermistors T1 and T2 varies, so will the signal S which enters the integrator 302. Again, referring to FIGS. 2(d) and 2(h), variations in the composite signal due to variations in the signal S will cause a rate variation at the output of integrator 302 which will, in turn, result in a corresponding rate change in the output from switches 304 and 306. As long as the physical quantity input to the transducer remains constant, so will the rate of output from the integrator 302 and the switches 304 and 306. The rate, or output count, from switches 304 will thus correspond to a particular input to the transducer elements. It can be easily seen that as the signal S varies from a level comparable to signal $S_I$ shown in FIG. 2(b) to a level such as signal $S_{II}$ shown in FIG. 2(f) the output rate from the integrator 302 and the switch 304 will increase from that shown in FIG. 2(d) to that shown in FIG. 2(h).

Referring back to FIG. 1, a nonlinearizer 114 is shown in phantom. This optional element may be included when the change of rate at point A is to be a desired function of the electrical signal emanating from the transducer 108. For example, if the electrical output from transducer 108 is linearly proportional to the physical quantity which acts on the transducer 108, the nonlinearizer 114 can be inserted such that the frequency of the signal at point A (or count output from the Schmitt trigger 106) is a logarithmic output function relative to changes in the physical quantity input to the transducer 108. Alternatively, where the physical quantity to the transducer 108 is a non-linear function proportional to the electrical signal produced at the output of the transducer 108, the nonlinearizer 114 may have a characteristic which may linearly relate the output from the integrator 104 with the physical quantity input to the transducer 108. An exponential nonlinearizer, for example, could linearize a logarithmic electrical output from the transducer 108.

A brief examination of FIG. 2(a) through 2(h) suggests features of the invention. First, the invention produces output frequency shifts at the output of the integrator 104, as well as countchanges from the Schmitt trigger 106, that are essentially linearly related to the electrical signal generated at the output of the transducer 108, assuming there is no nonlinearizer 114 included in the circuit. Also, the duty cycle of the driven signal exiting the driver 109 and the V signal from the Schmitt trigger 106 do not vary with the magnitude of the physical quantity input to the transducer; only the frequency of these signals is varied.

A noise analysis of the present circuit indicates that the circuit provides noise rejection characteristic of synchronous detectors; that is, only noises with frequency and phase similar to the operating frequency contribute significant noise to the output. Also, small quadratic noise and offset terms which exist may be generally neglected due to the inclusion of (1) the high-pass filter 112 in the outer loop and (2) the transducer-amplifier combination which are chosen to minimize the noise in the circuit.

Finally, it should be noted that only two wires are necessary to provide both power to the system and an output return. For example, referring to FIG. 3, a first lead to produce a positive bias input and a second lead to produce the negative bias input to the amplifiers and to the transistor 200 will also carry detectable "output" pulses when the transistor 200 is switched on and switched off, thereby providing an output count which can be communicated to a remote location. Extending this concept, a plurality of circuits may be configured locally with one more lead than the number of circuits. Either the positive leads or the negative leads may be combined into one common lead while one isolated power lead to each circuit may also carry information encoded in the pulse rate in its current demand. It is thus within the scope of the invention that a plurality of circuits, such as those shown in FIGS. 1, 3 or 4, or otherwise anticipated by the above description, may be used as sensors in parallel in a systems application. As seen in FIG. 5, this application may be extended by time division multiplexing one power lead 400 with a multiplexer 404 such that circuits 102', 102", and 102''' can be connected to the same pair of wires 400 and 402 and selected as desired by a multiplexer 404, or such similar one-of-many selector elements. The leads 400 and 402, in FIG. 3 for example, would correspond to the positive and negative bias inputs. In accordance with FIG. 5, the plurality of circuits 102', 102" and 102''' may or may not be of the same nature. The various sensors may be multiplexed or otherwise joined together to provide their respective output counts to a single remote detector (not shown in the figures).

Various other modifications, adaptations and alterations are of course possible in light of the above teachings. Therefore, it should be understood at this time that within the scope of the appended claims the invention may be practiced otherwise than as specifically described.

What is claimed is:

1. A method for producing an output frequency which is a function of the amplitude of a varying physical quantity acting on a transducer having an output impedance, the method comprising the steps of:

generating, in a relaxation oscillator with an input impedance, a digital drive signal at the output frequency;

driving the transducer with a function of the digital drive signal and producing an amplitude modulated bilevel signal in-phase with the drive signal and having an amplitude which is a function of the amplitude of the physical quantity sensed by the transducer;

isolating the output impedance of the driven transducer from the input impedance of the relaxation oscillator;

combining the drive signal and the amplitude modulated bilevel signal, thereby providing a composite signal; and feeding the composite signal back as the input to the relaxation oscillator.

2. A method as in claim 1, comprising the further step of:

amplifying the modulated signal before the drive signal and the amplitude modulated bilevel signal are combined.

3. A method as in claim 1, comprising the further step of:

filtering the amplitude modulated signal before the drive signal and the amplitude modulated signal are combined.

4. A method as in claim 2, comprising the further step of:

filtering the amplitude modulated signal before the drive signal and the amplitude modulated signal are combined.

5. A method as in claim 4, comprising the further steps of:

entering the produced amplitude modulated signal as an input into a nonlinearizing element having an output which is a predetermined function of the input to the nonlinearizing element such that the frequency varies in a predetermined nonlinear fashion with the transducer output, and nonlinearizing the amplitude modulated signal before the drive signal and the amplitude modulated signal are combined.

6. A frequency encoding closed loop circuit with transducer comprising:

an inner loop comprising a relaxation oscillator having a bilevel input of variable amplitude and having as an output a fixed amplitude digital drive signal, the frequency of the drive signal being a function of the amplitude of the bilevel input to the relaxation oscillator; and an outer loop comprising: (a) a transducer excitable by a physical quantity input of variable magnitude; (b) means for driving the transducer with the digital drive signal to provide an amplitude modulated output signal which selectively varies between two signal levels, the two signal levels being a function of the magnitude of the physical input; (c) the inner loop; (d) means for additively combining the amplitude modulated signal with the drive signal to provide a composite signal; (e) means for entering the composite signal at the input to the relaxation oscillator of the inner loop for controlling the frequency of the drive signal.

7. A frequency encoding closed loop circuit with transducer as in claim 6, further comprising:
means, positioned between the output of the transducer and the combining means, for amplifying the amplitude modulated signal before it enters the combining means.

8. A frequency encoding closed loop circuit with transducer as in claim 6, further comprising:
means, positioned between the output of the transducer and the combining means, for high-pass filtering the amplitude modulated signal before it enters the combining means.

9. A frequency encoding closed loop circuit with transducer as in claim 7, further comprising:
means, positioned between the output of the transducer and the combining means, for high-pass filtering the amplitude modulated signal before it enters the combining means.

10. A frequency encoding closed loop circuit with transducer as in claim 7, further comprising:
means, positioned between the output of the transducer and the combining means, for bandpass filtering the amplitude modulated bilevel signal before it enters the combining means.

11. A frequency encoding closed loop circuit with transducer as in claim 6, wherein the two signal levels of the amplitude modulated signal are different in absolute value.

12. A frequency encoding closed loop circuit with transducer as in claim 6, wherein the amplitude modulated signal has a constant duty cycle.

13. A frequency encoding closed loop circuit with transducer as in claim 6, wherein the transducer comprises:
means for emitting an optical signal and means for detecting the generated optical signal.

14. A frequency encoding closed loop circuit with transducer as in claim 13, wherein the driving means comprises a solid state gating device which is coupled to the means for emitting an optical signal, the gating device selectively permitting and blocking the passage of electrical current through the means for emitting an optical signal.

15. A frequency encoding closed loop circuit with transducer as in claim 14, wherein the means for emitting an optical signal is a light emitting diode and the means for detecting is a photodetector.

16. A frequency encoding closed loop circuit with transducer as in claim 6, wherein the relaxation oscillator comprises:
an integrator and a Schmitt trigger, wherein (a) the output of the integrator is connected to the input of the Schmitt trigger, (b) wherein the output of the Schmitt trigger loops back to the input of the integrator, and (c) wherein the input to the integrator represents the input to the inner loop and the output of the Schmitt trigger represents the output from the inner loop.

17. A frequency encoding closed loop circuit with transducer as in claim 7, wherein the transducer comprises a bridge network having at least one branch which comprises a thermistor.

18. A frequency encoder closed loop circuit with transducer as in claim 7 wherein the transducer comprises a strain gauge.

19. A sensor system comprising a plurality of frequency encoding closed loop circuits with transducers wherein each circuit comprises:
an inner loop comprising a relaxation oscillator having a digital input of variable amplitude and having as its output a fixed amplitude digital drive signal, the frequency of the drive signal being a function of the amplitude of the digital input to the relaxation oscillator;

an outer loop comprising: (a) a transducer excitable by a variable physical input, said transducer having an electrical output; (b) means for driving the transducer with the digital drive signal to provide an amplitude modulated signal from the transducer, which selectively varies between two signal levels, the two signal levels being a function of the magnitude of the physical quantity input (c) the inner loop; (d) means for additively combining the amplitude modulated signal with the drive signal to provide a composite signal; and (e) means for entering the composite signal as the input to the relaxation oscillator of the inner loop; and a pair of wires connected for providing power to all the circuits and for providing at a selected time, a signal indicative of the amplitude modulated signal from a selected one of the circuits.

20. A sensor system as in claim 19, further comprising:
means for controllably selecting the amplitude modulated signal to be conveyed along the pair of wires.

* * * * *